United States Patent [19]

Jesson

[11] 4,420,744
[45] Dec. 13, 1983

[54] KEYBOARD CROSSPOINT ENCODER HAVING N-KEY ROLLOVER

[75] Inventor: Joseph E. Jesson, Lake Villa, Ill.

[73] Assignee: Oak Industries Inc., Rancho Bernardo, Calif.

[21] Appl. No.: 233,903

[22] Filed: Feb. 12, 1981

[51] Int. Cl.³ .............................................. G08C 25/00
[52] U.S. Cl. ............................ 340/365 E; 340/365 S; 340/365 R
[58] Field of Search ............ 340/365 E, 365 S, 365 R; 179/90 K; 178/17 C; 400/477, 479, 479.1, 479.2

[56] References Cited

U.S. PATENT DOCUMENTS

| | | | |
|---|---|---|---|
| 3,920,926 | 11/1975 | Lenaerts et al. | 340/365 E |
| 4,106,011 | 8/1978 | Melanson et al. | 340/365 E |
| 4,231,016 | 10/1980 | Ueda | 340/365 E |

FOREIGN PATENT DOCUMENTS

| | | | |
|---|---|---|---|
| 971883 | 7/1975 | Canada | 340/365 E |
| 54-121026 | 9/1979 | Japan | 340/365 E |

*Primary Examiner*—Donnie Lee Crosland
*Attorney, Agent, or Firm*—Kinzer, Plyer, Dorn & McEachran

[57] ABSTRACT

A keyboard crosspoint encoder and a method of operating it which provide N-key rollover. The encoder has an information storage device. The matrix of crosspoint switches is scanned to determine the status of each switch and this information is stored in an array in the storage device. This array is checked to determine if a phantom switch condition exists. The encoder then provides an output of all newly-closed switches which are not involved in a phantom switch condition.

6 Claims, 4 Drawing Figures

KEYBOARD CROSSPOINT ENCODER HAVING N-KEY ROLLOVER

BACKGROUND OF THE INVENTION

This invention is concerned with keyboard crosspoint encoders. This type of device has a plurality of facing rows and columns of conductors which are normally held in spaced relation. Each intersection of a row and column provides a crosspoint switch which can be closed by pressing the conductors together. Typically, the conductors are formed on sheets of flexible material so that one conductor can contact another when the flexible sheet is subjected to external pressure. When the pressure is removed the sheet returns to its normal position with the conductors in non-contacting relation. The keyboard may include actuators which are disposed on top of the encoder where they are capable of transmitting actuating force to a particular crosspoint switch. Encoders used in typewriters, word processors, computer terminals and other keyboard arrangements will have actuators in the form of the usual keys. Keyboards of the type described have associated electrical circuitry for collecting and processing information from the encoder. This circuitry is conveniently provided in the form of a microcomputer. The microcomputer determines which crosspoint switches are depressed and supplies this information to the device in which the keyboard is incorporated.

One of the problems the processing circuitry must be capable of handling is the simultaneous closure of two or more crosspoint switches. This is a common situation which occurs when a human operator presses a second or third key before releasing a first or second key. This overlapping of closed switches is referred to as rollover.

There are basically three methods of handling a simultaneous switch closure situation. In the 'no rollover' method only the first key stroke is recognized and provided as valid output data. Once a key is pressed no other key will be recognized until the first key has been released. In the 'two-key rollover' method two keys simultaneously pressed are both recognized and provided as two valid and unique output codes, rather than losing one key as in the 'no rollover' method. However, if more than two keys are pressed at the same time, only the first two keystrokes will be recognized and provided as valid output data. In the 'N-key rollover' method any number of keys may be pressed simultaneously and each key will be correctly recognized and provided as valid output data. "N" represents a variable from one to a maximum number of keys.

The rollover method chosen for a particular keyboard encoder will depend on the particular application of the encoder. For example, 'no rollover' is desirable in a specialized banking terminal or calculator where numerical entries must be carefully entered. In contrast, in a high-speed typing application a secretary is typically trained to type in 20 to 30 millisecond bursts (for example, quickly typing t-h-e). In this application the tendency to "roll" or glide from one key to another is inevitable. 'N-key rollover' is desirable for this application since many keys may be pressed simultaneously. Studies have indicated that the use of N-key rollover reduces error rates by as much as 30% compared to no rollover or two-key rollover.

A major problem with N-key rollover in crosspoint encoders is the so-called phantom key or phantom switch situation. This will be explained in more detail below. Briefly, a phantom switch condition arises when three switches in a rectangular pattern in the encoder matrix are depressed. This results in an electrical path being formed which falsely indicates to the processing circuitry that the switch at the fourth corner of the rectangle is closed. If nothing were done to correct the phantom switch condition, the result would be the output as a valid key one which was never pressed.

The simplest solution to the phantom problem is to limit the encoder to no rollover or two-key rollover. But this eliminates the benefits of N-key rollover in high-speed typing. Another approach to the phantom switch problem could be to discard all keyboard data once a phantom condition is found anywhere in the matrix. This results in the rejection of the three keys involved in creating the phantom condition plus all other keys in the matrix, even though they were not involved in the phantom problem. Thus, a typist who inadvertently rests his or her fingers on a portion of the keyboard and thereby creates a phantom condition, will lose all keys pressed elsewhere in the matrix. Similarly, valid keys can be lost when a user strikes between two keys and actuates them both. This can lead to creation of a phantom condition and the above approach will reject all keys, whether or not they were potential phantom keys.

Phantom conditions can also be eliminated by isolating all of the crosspoint switches from one another by placing diodes between them. Or switches having inherent isolation such as magnetic hall-effect or capacitive sense switches could be used. But these approaches increase the cost of a keyboard and do not lend themselves to use with membrane type encoders.

SUMMARY OF THE INVENTION

This invention is related to a keyboard crosspoint encoder and a method of operating it. More particularly, the invention is directed to an encoder having N-key rollover.

A primary object of this invention is a keyboard crosspoint encoder having N-key rollover.

Another object is a keyboard crosspoint encoder which reduces the error rate due to phantom switch conditions.

Another object is a method of operating a crosspoint encoder having N-key rollover.

Another object is a method of operating a crosspoint encoder which reduces the error rate due to phantom switch conditions.

Another object is an improved keyboard encoder which does not require isolation of the crosspoint switches.

Another object is a keyboard encoder which does not require the use of specialized switches.

Another object is a crosspoint encoder and method of operating it which can be readily adapted for use in a membrane switch type of encoder.

Other objects will appear in the following specification, drawings and claims.

DESCRIPTION OF A PREFERRED EMBODIMENT

Figure 1:
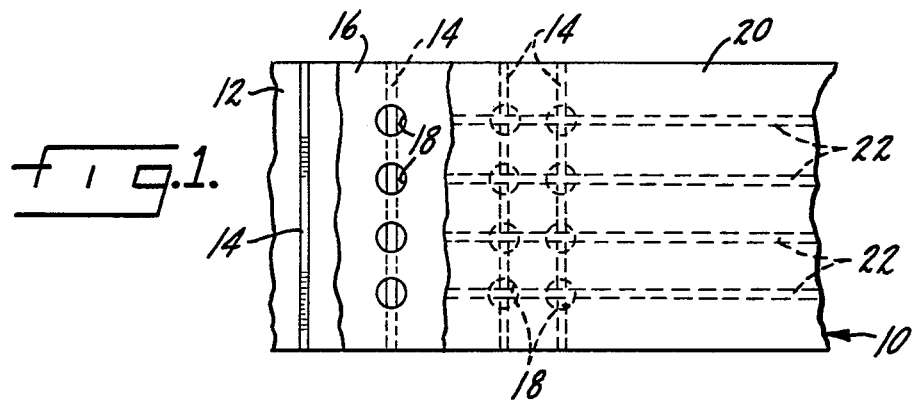
FIG. 1 is a top plan view of a typical keyboard crosspoint encoder.

FIG. 1 shows a typical membrane type keyboard crosspoint encoder 10. It will be understood that the encoder will be placed in a host device with electrical connections to the device. The encoder includes a substrate layer 12. The substrate is made of insulative material and may be rigid or flexible. The substrate carries a plurality of conductors 14 on its upper surface. In the embodiment shown the conductors 14 are arranged in vertical columns. The conductors may be formed by silk-screening, spray painting or other suitable technique. A spacer layer 16 made of insulative material lies on top of the substrate 12. The spacer may be a separate sheet of plastic material or it may be a layer of insulative paint applied to the substrate. The spacer 16 has a plurality of openings or holes 18 which provide access to the conductors 14 underneath it. A flexible membrane layer 20 lies on top of the spacer 16. The membrane is made of suitable plastic material. Several rows of conductors 22 are formed on the underside of the membrane. A plurality of actuators (not shown) may be disposed on top of the membrane. These actuators are designed to exert pressure on the membrane at the location of a crosspoint switch.

The spacer 16 normally holds the conductors 14 and 22 in spaced relation. When a user depresses the membrane in the vicinity of a row and column crosspoint the membrane flexes with the row conductor 22 on the membrane moving through the opening 18 in the spacer and into contact with the column conductor 14. This causes a closure of the switch. When the pressure on the membrane is released, it returns the conductors to their normal, non-contacting relation. It will be understood that other arrangements for a keyboard crosspoint encoder could be used and the arrangement shown in FIG. 1 is for illustrative purposes only. In particular, the number and disposition of the conductors could be other than as shown.

Figure 2:
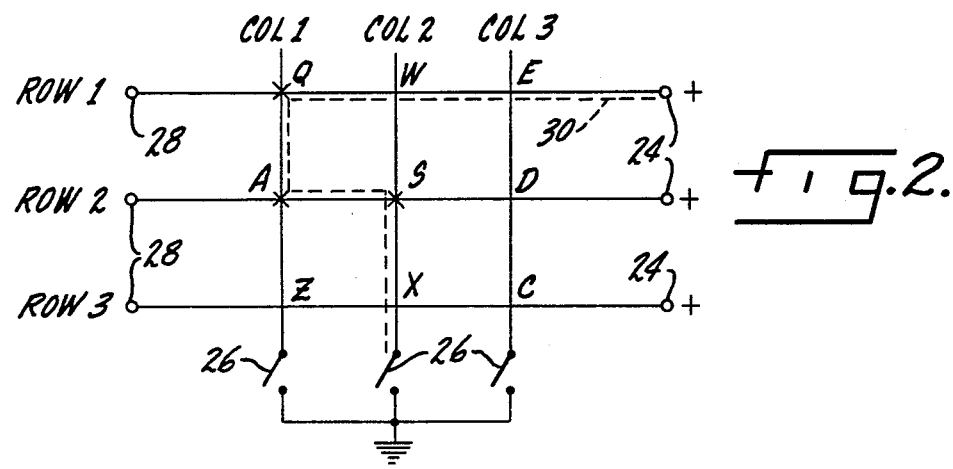
FIG. 2 is a schematic view of a portion of an encoder.

The operation of a crosspoint encoder will be explained in conjunction with FIG. 2. FIG. 2 represents a schematic showing of a portion of a typical crosspoint encoder. Three column conductors are designated Col. 1, Col. 2 and Col. 3. Three row conductors, which are normally spaced from the column conductors, are designated Row 1, Row 2 and Row 3. The crosspoints are designated as they would be in a portion of a standard typewriter keyboard. The crosspoint switches which are depressed are shown with an 'x' through the crosspoint. Thus, in the following discussion keys "Q", "A" and "S" are closed while the other crosspoint switches are open.

Each row conductor has a voltage applied at the point labeled 24. Each column conductor has a switch, shown schematically at 26, which connects the column to ground as shown. The information from the encoder is read off of the row conductors at the points labeled 28. The information reading and processing is performed by a single-chip microcomputer. An Intel 8048 micro-computer has been found acceptable for use in the present invention although other similar devices would be equally acceptable.

The microcomputer reads the key data into an array in its memory according to the following sequence of operations. First one of the columns is selected for scanning by closing its switch 26, thereby connecting the column to ground. Then the voltages are read from the rows into memory. If a crosspoint switch is closed it will ground the row conductor causing a low voltage at point 28. Conversely, if a crosspoint switch is open a high voltage will appear at point 28. So in the example of FIG. 2, switch 26 of Column 1 is closed and the voltages are read off of Rows 1-3. Thus Row 1 will read low, Row 2 will read low and Row 3 will read high. Next the switch 26 of Col. 1 is opened and that of Col. 2 is closed and again the voltages are read off of the row conductors. This scanning continues for the remainder of the keyboard. When the scanning is complete the microcomputer will have an array in its memory showing the status of each crosspoint switch. Before an output of the array can be provided, the array must be checked for the existence of a phantom switch condition.

The phantom switch condition arises whenever three switches at the corners of a rectangle in the encoder matrix are closed. If three corners of a rectangle are closed, the fourth corner will also be recognized, falsely, as being closed. This is caused by a sneak conductive path through the three corners of the rectangle which are actually closed. The sneak conductive path is available because a basic crosspoint encoder has no isolation between the switches. A phantom condition is shown in FIG. 2 where keys Q, A and S are actually closed. A sneak conductive path, designated by the line 30, is provided through those keys to ground. So when column 2 is selected for scanning, the voltage on Row 1 will be low by virtue of the path shown by line 30. Thus the "W" switch is falsely recognized as being closed. This is a phantom switch. A phantom switch condition can occur whenever three or more keys are pressed simultaneously in any rectangle within the matrix, e.g. If by some circumstance switches Q, E, and C are simultaneously depressed, the Z will be recognized as closed when in reality it is not.

Figure 3:
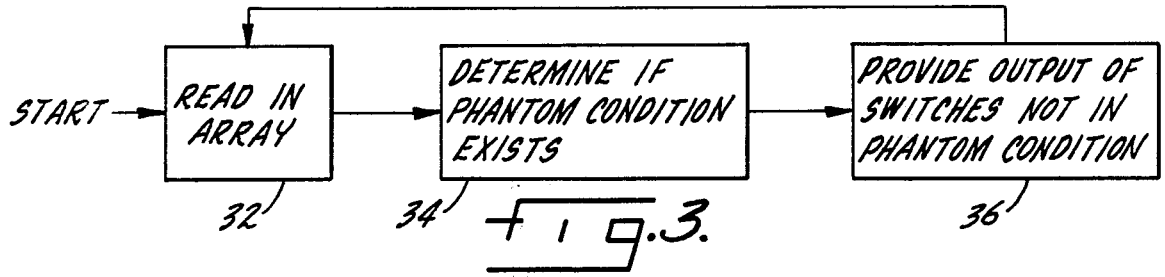
FIG. 3 is a block diagram showing the steps of one method of operation according to the present invention.

The present invention handles the phantom switch problem by the method shown diagrammatically in FIG. 3. The microcomputer starts by scanning the crosspoint encoder as described above. The data from the scan are read into an array as indicated at step 32. Next the array is searched to determine if a phantom condition exists. This is indicated as step 34. This is done by comparing the information in each row of the array with that in every other row of the array. A column-wise comparison of the information in each combination of row pairs is made. When looking at a particular pair of rows, if two closed switches are found in the same column and one of the two rows being compared contains more than one closed switch then a phantom condition exists. Once these switches are identified they are set aside or "ignored" for the time being. All newly-closed switches which are not involved in a phantom condition are provided as output to the host device (step 36). This process of locating phantom conditions, and providing output of those switches free of the phantom condition is performed in a time period which is shorter than the time period of the fastest possible keystroke, i.e., the processing is done in less than 20 milliseconds. This ensures that the encoder will be scanned at least once during every keystroke. After the output is provided the encoder is scanned again and a new array of data is read into memory. It can be seen that this method of operation provides a keyboard having N-key rollover because the output provided in step 36 includes all actuated switches, phantoms excepted, not just one or two.

When one of the three keys involved in a phantom condition is eventually released, the other two will be recognized during a subsequent scan and provided as valid output. But until a key is released, the three keys which are actually closed plus the phantom key which is recognized as closed (but in reality is not) will all four be ignored, i.e. none of them will be provided as output.

Figure 4:
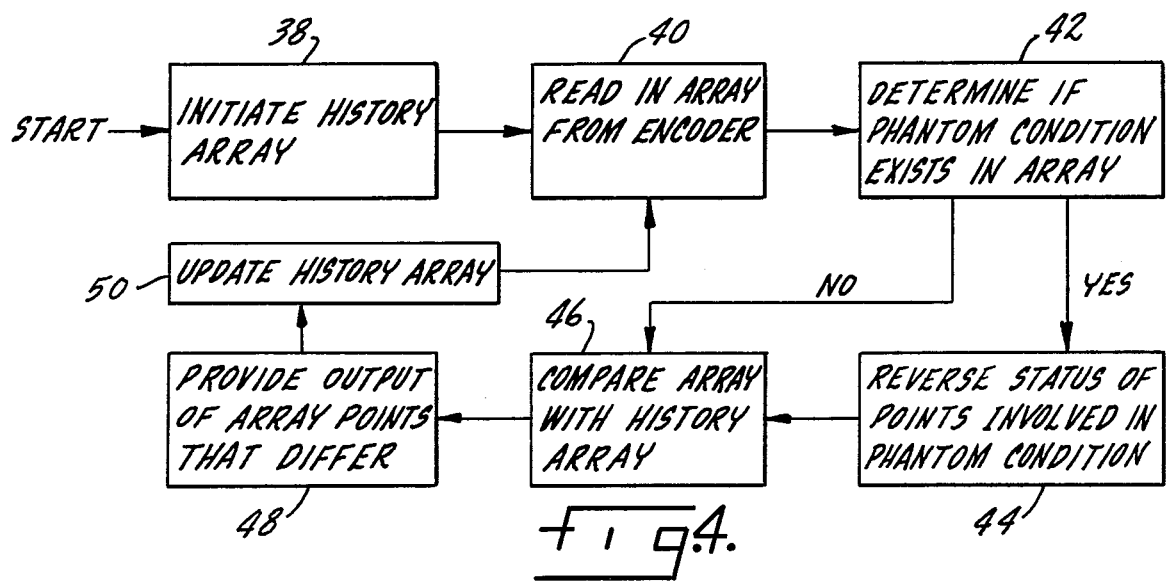
FIG. 4 is a block diagram showing the steps of an alternate method of operation.

FIG. 4 shows further details of a method of keyboard operation. This method utilizes two separate arrays in the microcomputer memory, a history array and a present or current array. The current array contains information from the latest scan of the encoder. The history array retains information from the next to last scan. Both arrays have the same size and shape as the matrix of encoder crosspoint switches.

The microcomputer starts in step 38 by initializing in its memory the history array. At the outset all entries in the history array show the crosspoint switches being open. The next step 40 is the data acquisition step where the keyboard is scanned and data is read into the current array in memory. In the step labeled 42 the current array is searched for phantom switch conditions. If a phantom condition is found the next step, labelled 44, is to change the status in the current array of those points involved in the phantom switch condition. In terms of the actual hardware involved, the phantom condition is four data locations at the corners of a rectangle in the array which have a voltage low condition. The status of these points is changed to a voltage high condition. The net effect of the step 44 is to "ignore" the four switches involved in the phantom switch condition. After the phantom condition has been removed, or if no phantom condition was found in the array, the operation proceeds to the comparison step labeled 46. The current array is compared with the history array. Any crosspoint switch whose condition has changed from open to closed is provided as output, as indicated at 48. It can be seen that comparison of the current array with the history array prevents repeated output of a key until it has been released and then pressed again. The history array is updated with the information of newly actuated and/or released keys, as indicated at 50. The operation continues by reading in a new set of data from the encoder.

It can be seen from the foregoing that the present invention provides a keyboard crosspoint encoder having N-key rollover and which will not provide erroneous output due to phantom switch conditions. The keyboard is readily adapted for membrane type encoders with no isolation of the crosspoints required. It will be understood that changes may be made in the details of the embodiments shown and described without departing from the spirit and scope of the invention.

I claim:

1. In a crosspoint encoder of the type having an information storage device and rows and columns of conductors which define a matrix of crosspoint switches, a method of operating the encoder comprising the steps of:
    a. scanning the rows and columns to detect the status of each crosspoint switch and storing this information in an array in the storage device;
    b. determining whether a phantom switch condition exists in the array;
    c. reversing the status of any crosspoints which are involved in a phantom switch condition; and
    d. providing an output of the array.

2. In a crosspoint encoder of the type having an information storage device and rows and columns of conductors which define a matrix of crosspoint switches, a method of operating the encoder comprising the steps of:
    a. initiating a history array in the information storage device;
    b. scanning the rows and columns to detect the status of each crosspoint switch and storing this information in an array in the storage device;
    c. determining whether a phantom switch condition exists in the array;
    d. reversing the status of any crosspoints which are involved in a phantom switch condition;
    e. comparing each crosspoint in the array to the corresponding crosspoint in the history array;
    f. providing an output of each crosspoint in the array which indicates a closed switch and whose correspondent in the history array does not indicate a closed switch; and
    g. updating the history array by reading all the data from the array into it.

3. The method of claim 1 or 2 wherein the step of determining the existence of a phantom switch condition comprises the steps of selecting a pair of rows in the array, comparing the information in each column position of the rows to determine if there are two columns where each row indicates a closed crosspoint switch, and repeating the above selecting and comparing steps until all combinations of row pairs have been selected.

4. A method of operating a crosspoint encoder including the steps of detecting which crosspoints are closed, determining whether a phantom switch condition exists and providing an output of those crosspoints which are not involved in a phantom switch condition.

5. A crosspoint encoder of the type having rows and columns of conductors which define a matrix of crosspoint switches, comprising, means for detecting which crosspoints are closed, means for determining whether a phantom switch condition exists and means for providing an output of those crosspoints which are not involved in a phantom switch condition.

6. A crosspoint encoder of the type having rows and columns of conductors which define a matrix of crosspoint switches, comprising an information storage device, means for detecting and storing in an array in said storage device the status of each crosspoint switch, means for locating a phantom switch condition in said array and for removing only switches involved in a phantom switch condition from the array, and means for providing an output of the array.

* * * * *